(12) United States Patent
Tetelbaum et al.

(10) Patent No.: US 7,043,708 B2
(45) Date of Patent: May 9, 2006

(54) INTELLIGENT CROSSTALK DELAY ESTIMATOR FOR INTEGRATED CIRCUIT DESIGN FLOW

(75) Inventors: Alexander Tetelbaum, Hayward, CA (US); Duc Van Huynh, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 281 days.

(21) Appl. No.: 10/458,547

(22) Filed: Jun. 9, 2003

(65) Prior Publication Data

US 2004/0250225 A1    Dec. 9, 2004

(51) Int. Cl.
*G06F 17/50* (2006.01)
(52) U.S. Cl. .................... 716/6; 716/4; 716/5
(58) Field of Classification Search ............. 716/4–6
See application file for complete search history.

(56) References Cited

U.S. PATENT DOCUMENTS

| | | | |
|---|---|---|---|
| 6,018,623 A * | 1/2000 | Chang et al. ............ | 716/6 |
| 6,269,467 B1 * | 7/2001 | Chang et al. ............ | 716/1 |
| 6,363,516 B1 * | 3/2002 | Cano et al. ............. | 716/5 |
| 6,405,348 B1 * | 6/2002 | Fallah-Tehrani et al. ...... | 716/4 |
| 6,493,853 B1 * | 12/2002 | Savithri et al. .............. | 716/5 |
| 6,721,930 B1 | 4/2004 | Sasaki et al. | |
| 6,907,590 B1 * | 6/2005 | Al-Dabagh et al. .......... | 716/6 |

OTHER PUBLICATIONS

"Fault Modeling and Simulation for Crosstalk in System-on-Chip Interconnects", Cuviello et al., Proceedings of the 1999 IEEE/ACM International Conference on Compute-Aided Design, Nov. 1999, pp. 297-303.

* cited by examiner

*Primary Examiner*—Vuthe Siek
*Assistant Examiner*—Brandon Bowers
(74) *Attorney, Agent, or Firm*—Fitch, Even, Tabin & Flannery

(57) ABSTRACT

A method of estimating crosstalk delay for an integrated circuit design flow includes steps of: (a) receiving an integrated circuit design; (b) selecting a list of blocks for which crosstalk delay is to be estimated from the integrated circuit design; (c) selecting one of a plurality of crosstalk delay estimation algorithms or no crosstalk delay estimation algorithm for each block in the list of blocks; (d) performing the selected one of the plurality of crosstalk delay estimation algorithms or no crosstalk delay estimation algorithm to estimate a delay for each block in the list of blocks; and (e) generating as output the estimated delay for each block in the list of blocks.

14 Claims, 6 Drawing Sheets

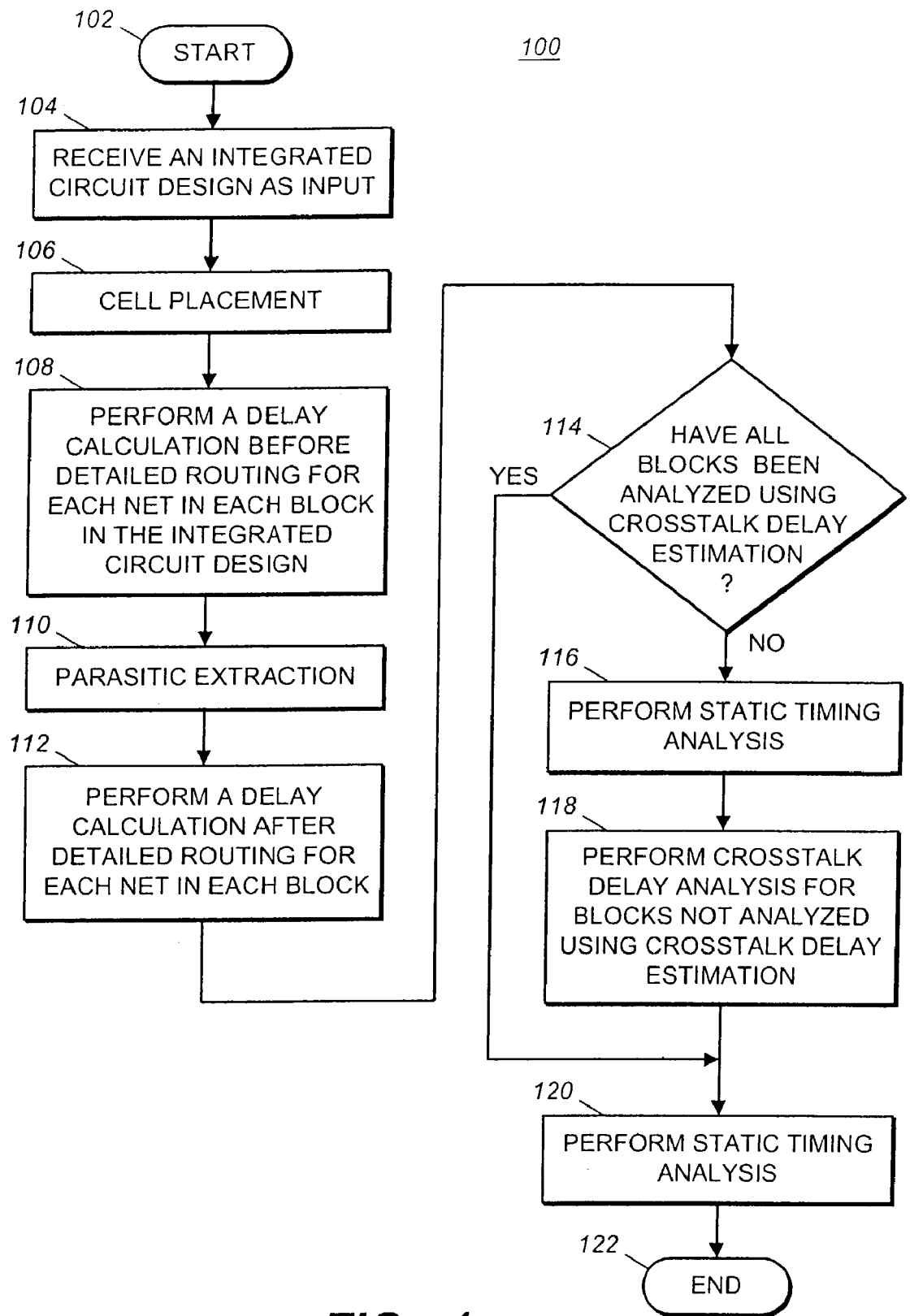
FIG._1

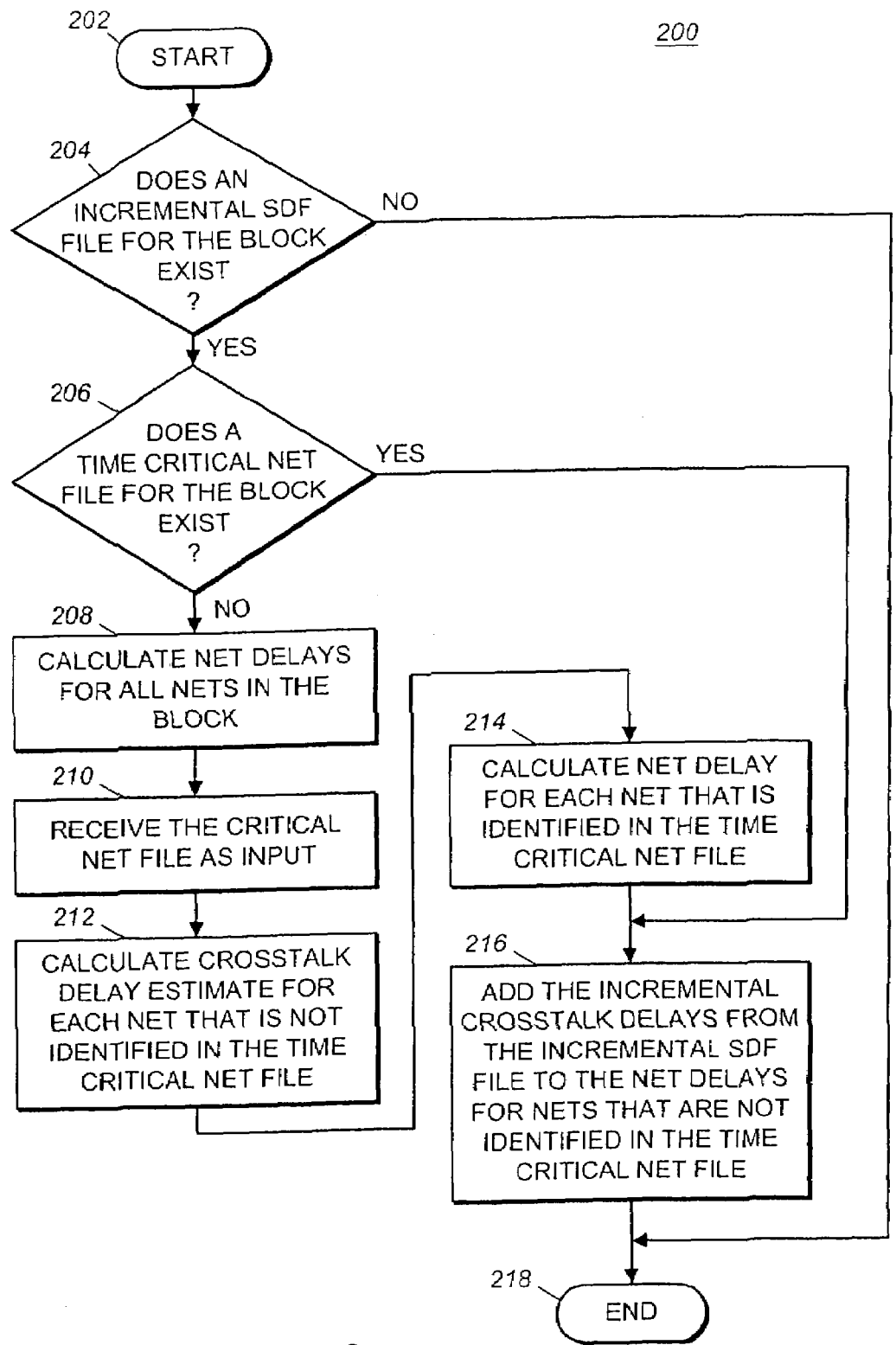
FIG._2

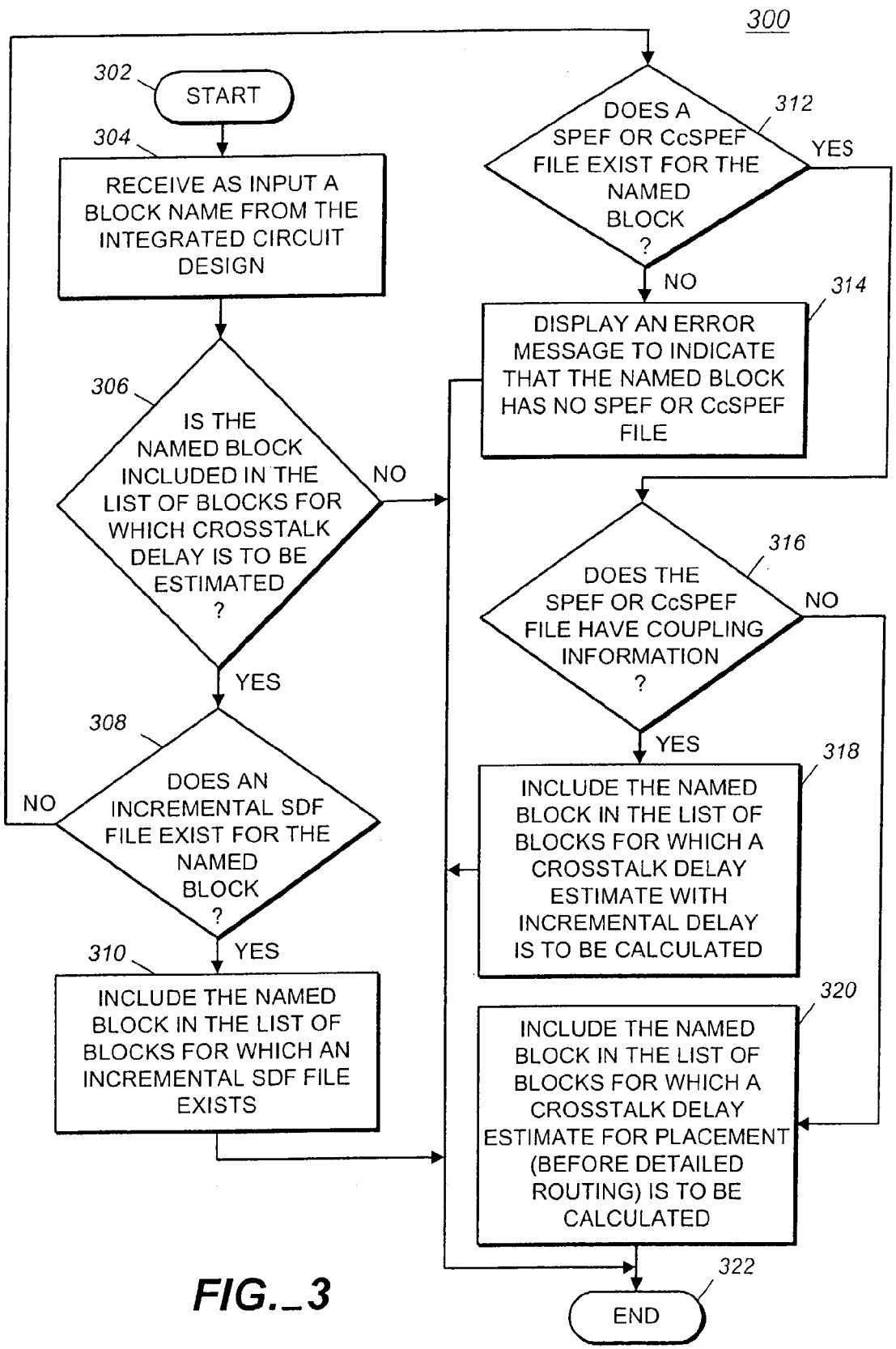
FIG._3

| Type of Crosstalk Estimation for Block b | Delay Calculator Enhancements |
|---|---|
| No Crosstalk Estimate | Process Block b without CDE or incSDF. Enhancemant: Include the names of all blocks that are in list_of_blocks_that_should_not_be_crosstalk_estimated for Crosstalk Delay Analyzer (the list of modules that were still not estimated and should be estimated by the Analyzer later on). |
| With CDE (along with b.CcSPEF or b.SPEF file) | Process Block b with CDE. If Block b belongs to placement_CDE_blocks (block before detailed routing along with b.SPEF file), then Enhancement 3a: Delay calculator uses it's method of CDE (like scaling total net capacitance) for the block. If Block b belongs to CDE_blocks (block before detailed routing along with b.SPEF file), then Enhancement 3b: Delay calculator uses it's delay CDE (like a numerical simulation or scaling coupling net capacitances) for the block. |
| With Incremental Delays (along with b.OC.incSDF files: the block was designed with Crosstalk Delay Analyzer (like Gatescope) and has incremental SDF files for WC and BC) | Process block b with its incSDF file plus CDE for other nets. Enhancement 4: Delay calculator calculates net delays as it is described in Fig. 2 taking into account incSDF and estimating crosstalk delays in other nets. The final SDF file includes crosstalk delays in all nets (with exception of very small delay critical nets that were filtered out by the Crosstalk Delay Analyzer). |

FIG._4

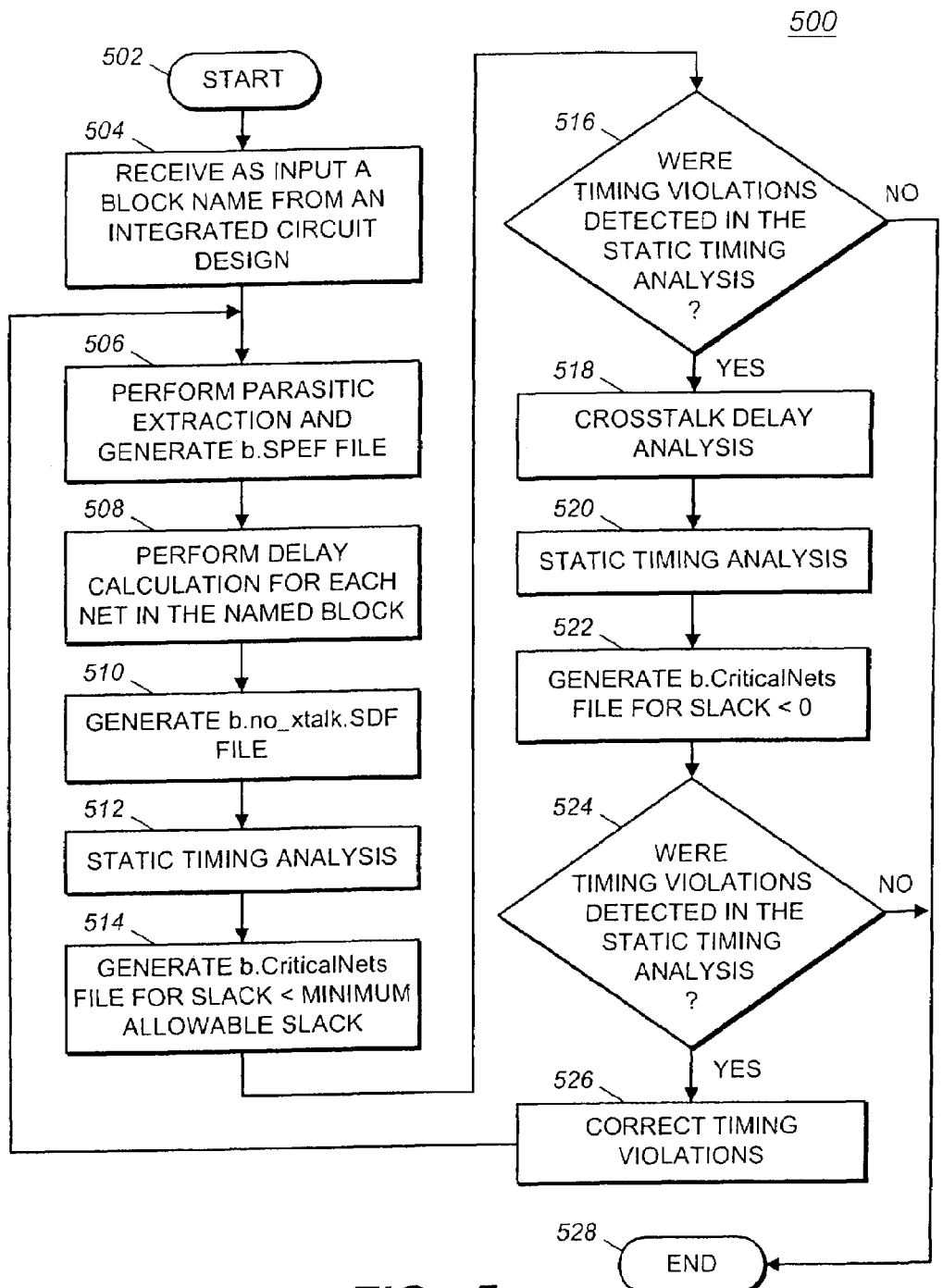
FIG._5
*(PRIOR ART)*

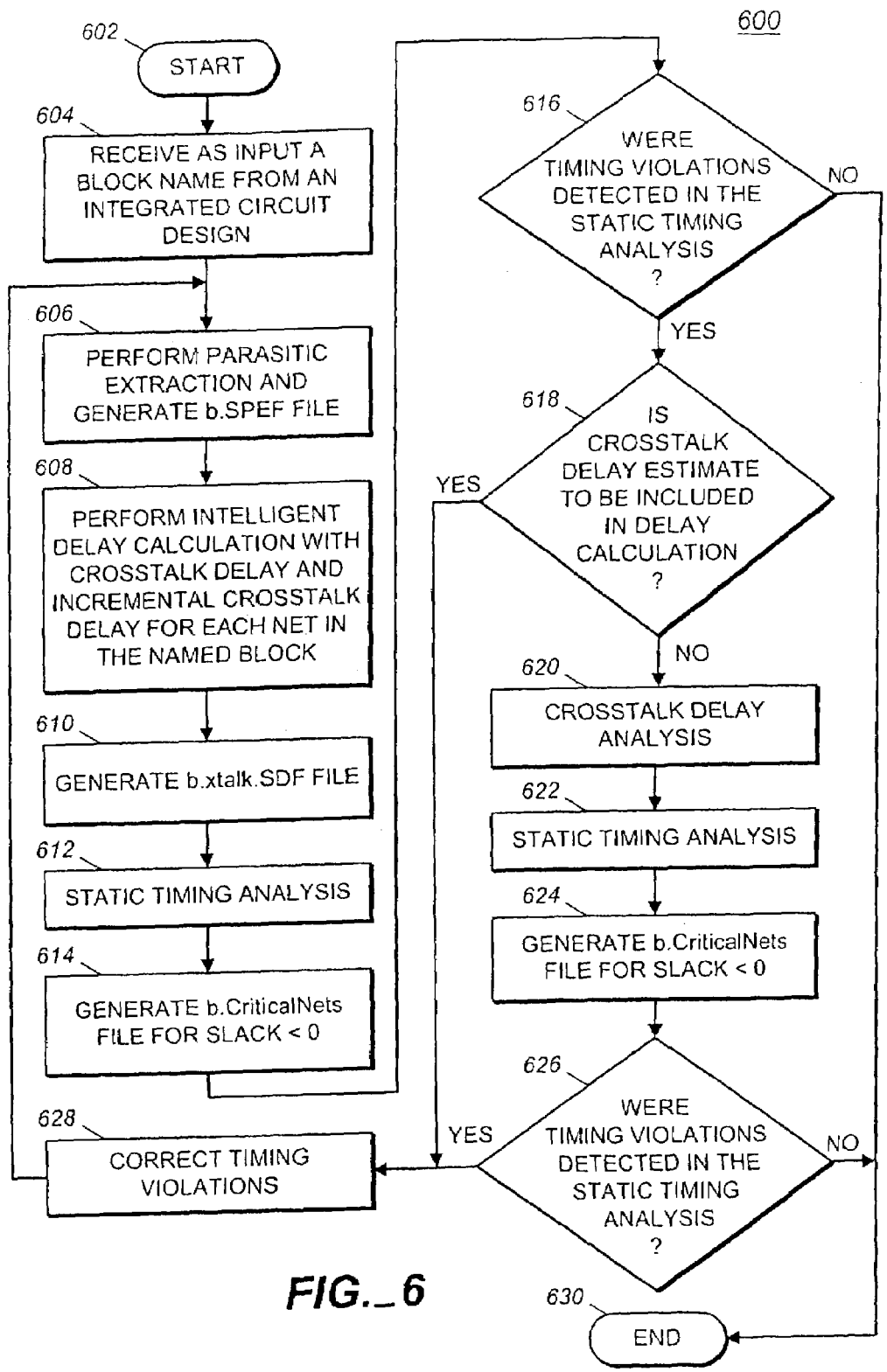
FIG._6

INTELLIGENT CROSSTALK DELAY ESTIMATOR FOR INTEGRATED CIRCUIT DESIGN FLOW

BACKGROUND OF THE INVENTION

1. Field of the Invention

The present invention is directed to integrated circuit design software used in the manufacture of integrated circuits. More specifically, but without limitation thereto, the present invention is directed to estimating delay together with crosstalk delay in an integrated circuit design.

2. Description of Related Art

In one previous approach to integrated circuit design, a crosstalk analysis is performed after placement and detailed routing. A timing closure step is then performed to detect timing violations in the design, and another placement and detailed routing is performed to resolve the timing violations. The crosstalk analysis is typically based on a transistor level simulation and is highly accurate. A disadvantage of this method is that several iterations may be required to resolve all timing violations. The most time consuming step is timing closure after parasitic analysis, that is, with crosstalk analysis.

SUMMARY OF THE INVENTION

The present invention enhances previous methods of integrated circuit design with the following new features:

(1) a new design flow and a new delay calculator that can accommodate any combination of crosstalk delay estimation algorithms, both with and without a crosstalk component;

(2) processing each block in the integrated circuit design with the highest degree of accuracy obtainable for the block;

(3) a new method of implementing crosstalk analysis; and (4) a minimum number of iterations required to complete the design flow.

In one aspect of the present invention, a method of estimating crosstalk delay for an integrated circuit design flow includes steps of:

(a) receiving an integrated circuit design;

(b) selecting a list of blocks for which delay and crosstalk delay is to be estimated from the integrated circuit design;

(c) selecting one of a plurality of crosstalk delay estimation algorithms or no crosstalk delay estimation algorithm for each block in the list of blocks;

(d) performing the selected one of the plurality of crosstalk delay estimation algorithms or no crosstalk delay estimation algorithm to estimate a delay for each block in the list of blocks; and (e) generating as output the estimated delay for each block in the list of blocks.

In another aspect of the present invention, a computer program product for estimating crosstalk delay for an integrated circuit design flow includes:

a medium for embodying a computer program for input to a computer; and a computer program embodied in the medium for causing the computer to perform steps of:

(a) receiving an integrated circuit design;

(b) selecting a list of blocks from the integrated circuit design for which a crosstalk delay is to be estimated for each block in the list of blocks;

(c) selecting one of a plurality of crosstalk delay estimation algorithms or no crosstalk delay estimation algorithm for each block in the list of blocks;

(d) performing the selected one of the plurality of crosstalk delay estimation algorithms or no crosstalk delay estimation algorithm to estimate a delay for each block in the list of blocks; and (e) generating as output the estimated crosstalk delay for each block in the list of blocks.

In a further aspect of the present invention, a method of design flow for an integrated circuit includes steps of:

(a) receiving as input a design block in an integrated circuit design;

(b) selecting one of a plurality of crosstalk delay estimation algorithms or no crosstalk delay estimation algorithm for the design block;

(c) estimating a crosstalk delay or no crosstalk delay from the selected one of the plurality of crosstalk delay estimation algorithms or no crosstalk delay estimation algorithm;

(d) performing a static timing analysis to detect whether any timing violations exist in the design block; and (e) if a timing violation is detected in the static timing analysis, then correcting the timing violation.

In another aspect of the present invention, a method of design flow for an integrated circuit includes steps of:

(a) receiving as input a design block in an integrated circuit design;

(b) selecting one of a plurality of crosstalk delay estimation algorithms or no crosstalk delay estimation algorithm for the design block;

(c) estimating a crosstalk delay or no crosstalk delay from the selected one of the plurality of crosstalk delay estimation algorithms or no crosstalk delay estimation algorithm;

(d) performing a static timing analysis on the design block to detect whether any timing violations exist in the design block; and (e) if a timing violation is detected in the static timing analysis, then correcting the timing violation and transferring control to step (b).

In a further aspect of the present invention, a computer program product for design flow for an integrated circuit includes:

a medium for embodying a computer program for input to a computer; and a computer program embodied in the medium for causing the computer to perform steps of:

(a) receiving as input a design block in an integrated circuit design;

(b) selecting one of a plurality of crosstalk delay estimation algorithms or no crosstalk delay estimation algorithm for the design block;

(c) estimating a crosstalk delay or no crosstalk delay from the selected one of the plurality of crosstalk delay estimation algorithms or no crosstalk delay estimation algorithm;

(d) performing a static timing analysis to detect whether any timing violations exist in the design block; and (e) if a timing violation is detected in the static timing analysis, then correcting the timing violation.

DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart of an intelligent delay calculator according to an embodiment of the present invention;

FIG. 2 illustrates a flow chart 200 of a function for including incremental crosstalk delay information in the calculation of net delay according to an embodiment of the present invention;

FIG. 3 illustrates a flow chart for a method of selecting a crosstalk delay algorithm for each block in an integrated circuit design according to an embodiment of the present invention;

FIG. 4 illustrates a table of scenarios and other delay calculator enhancements according to an embodiment of the present invention;

FIG. 5 illustrates a flow chart of a method of timing closure according to the prior art; and FIG. 6 illustrates a flow chart of a method of timing closure according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Crosstalk delays in an integrated circuit design may be estimated by an incremental delay calculator. The incremental delay calculator uses the total capacitance or the cross-coupling capacitance, if available, of the interconnect parasitic network associated with each net in the design to estimate crosstalk delay before or after the net routing step. Anticipating crosstalk delay during various steps of the integrated circuit design is referred to herein as crosstalk delay estimation (CDE). For example, after the cells of an integrated circuit design have been placed, but before detailed routing is performed, no cross-coupling information is yet available. At this point, the total capacitance of a net may be increased by some percentage to estimate possible future crosstalk, which is equivalent to anticipating greater cross-coupling capacitance for longer connecting wires. After detailed routing is performed for an integrated circuit design, or block, then cross-coupling information is available, and more accurate methods for estimating crosstalk delay may be used. For example, one method of estimating crosstalk delay is to scale coupling capacitances by an emprical scaling factor. Another method of estimating crosstalk delay is numerical calculations from simulation methods based on a variety of models and several mathematical techniques. While these methods may be more accurate, they generally require significantly more processing time. Examples of these simulation methods include SPICE (simulation program with integrated circuit emphasis) and AWE (asymptotic waveform evaluation). A problem with this approach is that crosstalk delay estimation should be applied to all blocks. A block may be, for example, a module, a core, or an application-specific integrated circuit (ASIC), including the top-level design and many cores.

In general, a block may be analyzed with or without crosstalk delay estimation. Examples of crosstalk delay estimation include crosstalk delay estimation based on scaling coupling capacitances and crosstalk delay estimation based on an incremental delay standard delay format (SDF) file that contains predetermined information about additional delays resulting from crosstalk. The incremental delay SDF file may be obtained, for example, by performing a crosstalk analysis with commercially available software analysis tools based on SPICE (simulation program with integrated circuit emphasis). Accordingly, one of the following approaches to integrated design flow for a block may be used:

(1) The block may be completely designed without crosstalk delay estimation, and timing closure is performed by using a crosstalk analysis tool. In this case, the block should include incremental SDF files generated by the crosstalk analysis tool for best case operating conditions (BC) and worst case operating conditions (WC).

(2) The block may be completely designed including crosstalk delay estimation incorporated in the delay calculator after detailed routing. In this case, the block should have a complete coupling standard physical exchange format (CcSPEF) file. The CcSPEF file reports all coupling capacitances, in contrast to an ordinary SPEF file that does not include coupling capacitances, however, the total net capacitance is the same in both CcSPEF and SPEF files.

(3) The block may be partially designed, for example, only through the cell placement step, including crosstalk delay estimation before detailed routing incorporated in the delay calculator. In this case, the block should have an ordinary SPEF file. The SPEF file may be obtained, for example, by a capacitance estimation tool after the cell placement step according to well-known techniques.

(4) The block may be designed with no crosstalk delay estimation. In this case, timing closure may be performed by crosstalk delay estimation incorporated in the delay calculator or by a crosstalk analysis tool at a later time.

Previous delay calculators cannot accommodate a mix of different crosstalk delay estimation algorithms, for example, reusing incremental delay information for some nets, calculating crosstalk delay estimation for some nets, applying no crosstalk delay estimation for some nets, and applying crosstalk delay estimation before detailed placement for the top-level design block but after detailed routing for other blocks in the integrated circuit design. Another example might be applying crosstalk delay estimation in the top level of the design and some block-level cores of the design, and applying incremental delay calculation for the remaining block-level cores of the design. Disadvantageously, delay calculators of the prior art are not capable of accommodating different crosstalk delay estimation algorithms for different blocks in the same integrated circuit design.

Preferably, integrated circuit designs should be supported in which some blocks that include incremental SDF files generated by a crosstalk analysis tool are included in an integrated circuit design in which the user wants to apply a crosstalk delay estimation algorithm to avoid crosstalk analysis for the top level of the design later on. In addition, some blocks, such as the top level of the design, are sometimes designed without any crosstalk delay estimation. These blocks will be analyzed using a crosstalk analysis tool at a later stage in the design flow with greater accuracy. On the other hand, some blocks should be analyzed with different crosstalk delay estimation algorithms depending on the state of the blocks. For example, the top-level block may be analyzed either just after cell placement and before detailed routing, or the block may be analyzed after detailed routing. The analysis affects chip level integration differently at various stages in the design flow, for example, after cell placement or after final routing, because different crosstalk delay estimation techniques are applied.

At the cell placement stage, if a block is using crosstalk delay estimation, it may be desirable to include a placement capacitance multiplier at the block level, but to apply a more accurate crosstalk delay estimation algorithm for other blocks after final routing.

After detailed routing, when the block level SPEF file is available with cross-coupling information, a crosstalk delay estimation algorithm should be applied that accounts for coupling capacitances for the block level, while using even more accurate crosstalk delay information for blocks which have incremental SDF files (generated by a crosstalk analysis tool).

If timing closure was performed on the block with a crosstalk delay estimation algorithm, then the same crosstalk delay estimation algorithm should always be used for the block delay calculation, and the appropriate crosstalk delay estimation algorithm should be selected for the top-level block according to its state in the design flow.

The present invention provides a delay calculator for an integrated circuit design flow that advantageously accommodates any combination of crosstalk delay estimation algorithms, both with and without crosstalk components in any of the forms described above. Each block in the integrated circuit design is analyzed with the crosstalk delay estimation algorithm having the highest accuracy available for the block. The present invention also provides a novel design flow for crosstalk analysis of individual blocks, and minimizes the number of iterations in the integrated circuit design flow required for timing closure.

In one aspect of the present invention, a method of estimating crosstalk delay for an integrated circuit design flow includes steps of:

(a) receiving an integrated circuit design;

(b) selecting a list of blocks for which crosstalk delay is to be estimated from the integrated circuit design;

(c) selecting one of a plurality of crosstalk delay estimation algorithms or no crosstalk delay estimation algorithm for each block in the list of blocks;

(d) performing the selected one of the plurality of crosstalk delay estimation algorithms or no crosstalk delay estimation algorithm to estimate a delay for each block in the list of blocks; and (e) generating as output the estimated delay for each block in the list of blocks.

FIG. 1 illustrates a flow chart 100 of an intelligent delay calculator according to an embodiment of the present invention.

Step 102 is the entry point of the flow chart 100.

In step 104, an integrated circuit design is received as input, for example, as a netlist.

In step 106, cell placement is performed according to well-known techniques for each block in the integrated circuit design. The cell placement may be performed with or without a selected crosstalk estimation delay algorithm for each block, depending on the state of the block and the user's choice.

In step 108, a delay calculation before detailed routing is performed for each net in each block in the integrated circuit design according to well-known techniques. The delay calculation may be performed with or without a selected crosstalk estimation delay algorithm for each block, depending on the state of the block and the user's choice.

In step 110, a parasitic extraction is performed according to well-known techniques to generate a coupling capacitance standard physical exchange format (CcSPEF) file that contains crosstalk information for each net in each block.

In step 112, a delay calculation after detailed routing is performed for each net in each block in the integrated circuit design according to well-known techniques. The delay calculation may be performed with or without a selected crosstalk estimation delay algorithm for each block, depending on the state of the block and the user's choice. Also, the delay calculation may be performed with or without an incremental SDF file for each block in the integrated circuit design.

In step 114, if all blocks have been analyzed using crosstalk delay estimation, then control is transferred to step 118. Otherwise, control is transferred to step 116.

In step 116, a static timing analysis is performed according to well-known techniques.

In step 118, a crosstalk delay analysis is performed according to well-known techniques for all blocks not yet analyzed with a selected crosstalk delay estimation algorithm.

In step 120, a static timing analysis is again performed to account for the crosstalk delay calculated in step 118.

Step 122 is the exit point of the flow chart 100.

An important feature of the present invention is the inclusion of incremental SDF information in the delay calculator for all blocks that are accompanied by incremental SDF files. Some parameters, such as crosstalk incremental delay, exist only for some nets, because crosstalk incremental delay is generally obtained by transistor level simulation. Transistor level simulation is extremely time consuming and is typically performed only for time critical nets. The time critical nets are generally identified in a specific file named, for example, "b.CriticalNets", where "b" is the name of the block. Moreover, crosstalk incremental delay values usually exist only for some time critical nets, because time critical nets with small delays are typically filtered out by a crosstalk analsyis tool.

The delay calculator should preferably include a crosstalk delay estimate for all nets that are not identified in the "b.CriticalNets" file, that is, nets that do not have crosstalk incremental delay values included in the incremental SDF file and that were not filtered out by the crosstalk analysis tool. The crosstalk delay estimate is important, because the majority of nets that do not have crosstalk incremental delay values will not be estimated with crosstalk impact, and an inconsistency in delay prediction would result, for example, compared to blocks for which algorithms for crosstalk delay estimation are used.

FIG. 2 illustrates a flow chart 200 of a function for including incremental crosstalk delay information in the calculation of net delay according to an embodiment of the present invention.

Step 202 is the entry point of the flow chart 200.

In step 204, if an incremental SDF file for the block does not exist, then control transfers to step 216. Otherwise, control is transferred to step 206.

In step 206, if a time critical net file for the block exists, then control is transferred to step 210. Otherwise, control is transferred to step 208.

In step 208, net delays are calculated for all nets in the block, and control is transferred to step 216.

In step 210, the time critical net file is received as input.

In step 212, a crosstalk delay estimate is calculated for each net that is not identified in the time critical net file according to a selected crosstalk delay estimation algorithm.

In step 214, a net delay is calculated for each net that is identified in the time critical net file without a crosstalk delay estimate.

In step 216, the incremental crosstalk delays are added from the incremental SDF file to the net delays for nets that are not identified in the time critical net file.

Step 218 is the exit point of the flow chart 200.

Another important feature of the present invention is the addition of delay calculation options that may be selected by the user for processing the top level block and cores according to a crosstalk delay estimation algorithm or no crosstalk delay estimate. For example, a list of blocks for which a crosstalk delay estimate is to be calculated may be composed or generated for the intelligent delay calculator as well as a list of blocks for which a crosstalk delay estimate is not to be calculated. If no list of blocks is specified, then the option may be performed (or if negated, not performed) for all blocks in the integrated circuit design.

Because a block may be used or instantiated in the integrated circuit design several times, the block name rather than the names of the instances is preferably used to avoid a possible conflict and to minimize the size of the list of blocks. If a block is specified to be processed without crosstalk delay estimation, then the delay calculator inserts the block name into a list of blocks for which a crosstalk delay estimate is not to be calculated.

For each block for which a crosstalk delay estimate is to be calculated, the delay calculator selects which crosstalk delay estimate algorithm should be used, that is, with incremental crosstalk delay information, or crosstalk delay estimation after detailed routing, or crosstalk delay estimation before detailed routing.

FIG. 3 illustrates a flow chart 300 for a method of selecting a crosstalk delay algorithm for each block in an integrated circuit design according to an embodiment of the present invention.

Step 302 is the entry point of FIG. 3.

In step 304, a design block from the integrated circuit design is received as input.

In step 306, if the design block is included in the list of blocks for which crosstalk delay is to be estimated, then control is transferred to step 308. Otherwise, no crosstalk delay is estimated for the design block, and control is transferred to step 322.

In step 308, if an incremental SDF file exists for the design block, then control is transferred to step 310. Otherwise, control is transferred to step 312.

In step 310, the design block is included in the list of blocks for which an incremental SDF file exists, and control is transferred to step 322.

In step 312, if a SPEF or CcSPEF file exists for the design block, then control is transferred to step 314, otherwise, control is transferred to step 316.

In step 314, an error message is displayed to indicate that the design block has no SPEF or CcSPEF file, and control is transferred to step 322.

In step 316, if the SPEF or CcSPEF file includes cross-coupling information, then control is transferred to step 318. Otherwise, control is transferred to step 320.

In step 318, the design block is included in the list of blocks for which a crosstalk delay estimate is to be calculated with a selected crosstalk delay estimation algorithm, and control is transferred to step 322.

In step 320, the design block is included in the list of blocks for which a crosstalk delay estimate for placement (before detailed routing) is to be calculated.

Step 322 is the exit point of the flow chart 300.

Alternatively, the following enhancements may be included in the delay calculator:

Enhancement 1. The delay calculator may detect and report inconsistent combinations of options, for example:

(1) the design block is not included in any list belonging to the set of lists L, where L includes the list of blocks for which a crosstalk delay estimate is to be calculated, the list of blocks for which an incremental SDF file exists, the list of blocks for which a crosstalk delay estimate is to be calculated after detailed routing, and the list of blocks for which a crosstalk delay estimate is to be calculated after placement (before detailed routing); and (2) the design block belongs to more than of the lists in the set of lists L.

Enhancement 2. The delay calculator may also determine whether an SPEF file or a CcSPEF file is associated with the top level block and each core block in the integrated circuit design.

FIG. 4 illustrates a table of scenarios and other delay calculator enhancements according to an embodiment of the present invention.

If no crosstalk delay estimate is to be calculated for the design block, then the design block is added to the list of blocks for which a crosstalk delay estimate is to be calculated by the crosstalk analysis tool. The blocks for which a crosstalk delay estimate is not calculated by the delay calculator should be estimated by the crosstalk analysis tool at a later stage in the integrated circuit design.

Enhancement 3a: If a crosstalk delay estimate is to be calculated for the design block, and if the design block is included in the list of blocks for which a crosstalk delay estimate is to be calculated after placement (before detailed routing), then the delay calculator applies an appropriate method of crosstalk delay estimation, for example, scaling net total capacitance for the design block.

Enhancement 3b: If a crosstalk delay estimate is to be calculated for the design block, and if the design block is included in the list of blocks for which a crosstalk delay estimate is to be calculated after detailed routing, then the delay calculator applies an appropriate method of crosstalk delay estimation, for example, numerical simulation or scaling net coupling capacitances for the design block.

Enhancement 4: If a crosstalk delay estimate is to be calculated for the design block with an associated incremental delay SDF file and incremental delay SDF files for best case and worse case, that is, if the design block was designed with a crosstalk analysis tool, then the delay calculator calculates net delays as described above with reference to FIG. 2, taking into account incremental crosstalk delay and estimating crosstalk delay in other nets. The final SDF file includes crosstalk delays for all nets, with the exception of the time critical nets having a very small delay that were filtered out by the crosstalk delay analysis tool. The delay calculator estimates crosstalk delays in all other nets that do not have crosstalk incremental delays in the incremental SDF file. These crosstalk delay estimates should not be ignored as having very small incremental delays. Although retaining these delays is a conservative measure, it is consistent with crosstalk delay estimation used for other blocks, and it is more accurate than ignoring crosstalk delays in other nets that do not have crosstalk incremental delays in the incremental SDF file. Further, if crosstalk delay estimates are not calculated for these nets, a timing violation may be go undetected. The delay calculator should calculate net delays and then add the corresponding crosstalk incremental delays from the incremental delay SDF files for all nets that have crosstalk incremental delay. Crosstalk delay estimates should not be calculated for these nets.

Enhancement 5: The delay calculator may display the following additional information for the integrated circuit design and for each design block into the log and SDF files:

(1) If all blocks were analyzed with crosstalk impact, then the delay calculator includes an appropriate comment, for example:

"All blocks were analyzed with crosstalk impact" and

"The SDF file includes all incremental delays, and there is no need to run a crosstalk delay analysis for any block". Also, the SDF file name should include the suffix "with_crosstalk.SDF".

(2) If not all blocks were analyzed with crosstalk impact, then the delay calculator includes an appropriate comment, for example:

"The following blocks were analyzed with crosstalk impact: <block names>",

"The following blocks were analyzed without crosstalk impact: <block names>" and "Run a crosstalk delay analysis for the following blocks: <block names>";

(3) The cross-talk flow, the crosstalk delay estimate, and the incremental delay SDF properties for each design block=<block name>:

type of cross-talk estimate={"none", "incremental delay SDF+crosstalk delay estimate", "crosstalk delay estimate"}, design stage={"before detailed routing" or "after detailed routing"}, SPEF type={"SPEF with coupling capacitances (CcSPEF)" or "SPEF without coupling capacitances"}, the crosstalk delay estimate method that was used for the design block, and if timing closure is performed by a crosstalk delay analysis tool, then the message "incremental crosstalk delay file exists" is displayed, otherwise the message "incremental delay file does not exist" is displayed.

FIG. 5 illustrates a flow chart 500 of a method of timing closure according to the prior art.

Step 502 is the entry point for the flow chart 500.

In step 504, a name of a block is received as input from an integrated circuit design.

In step 506, a parasitic extraction is performed on the design block, and the output file "b.SPEF" is generated.

In step 508, a delay calculation is performed on the design block without a crosstalk delay estimate for each net in the design block.

In step 510, a "b.no_xtalk.SDF" file is generated as output from the delay calculation in step 508.

In step 512, a static timing analysis is performed.

In step 514, a "b.CriticalNets" file is generated from the static timing analysis for the design block. The time critical nets are defined as those nets having a path margin that is less than the minimum allowable path margin, or slack. Usually, the minimum allowable path margin is about 300–800 picoseconds for the setup time constraint and about 100–200 picoseconds for the hold time constraint. The specific minimum allowable path margins are determined in advance and do not account for the design clock frequency, chip technology, or the specific interconnect and crosstalk coupling in the design. If the value selected for the minimum allowable path margin is low, then some timing violations may be overlooked due to crosstalk impact. If the value selected for the minimum allowable path margin is high, then the number of time critical nets is high, and the time required for crosstalk delay analysis will be high.

In step 516, if timing violations are detected in the static timing analysis of the design block, then control is transferred to step 518. Otherwise, control is transferred to step 528.

In step 518, a crosstalk talk analysis is performed for the design block, for example, by a crosstalk analysis tool such as Gatescope.

In step 520, a second static timing analysis is performed to account for the crosstalk delays calculated in step 518.

In step 522, a "b.CriticalNets" file is generated from the static timing analysis for the design block for nets having a path margin less than zero.

In step 524, if timing violations are detected in the static timing analysis performed in step 520, then control is transferred to step 526. Otherwise, control is transferred to step 528.

In step 526, the timing violations detected by the static timing analysis in step 520 are corrected, for example, by adjusting the placement or routing of cells in the design block. Control is then transferred to step 506.

Step 528 is the exit point of the flow chart 500.

In another aspect of the present invention, a design flow for an integrated circuit advantageously minimizes the number of time critical nets in each design block in the integrated circuit design. In one embodiment, a method of design flow for an integrated circuit includes steps of:

(a) receiving as input a design block in an integrated circuit design;

(b) selecting one of a plurality of crosstalk delay estimation algorithms for the design block;

(c) estimating a crosstalk delay from the selected one of the plurality of crosstalk delay estimation algorithms;

(d) performing a static timing analysis to detect whether any timing violations exist in the design block; and (e) if a timing violation is detected in the static timing analysis, then correcting the timing violation.

The plurality of crosstalk delay estimation algorithms may include a null algorithm, that is, no crosstalk delay is estimated.

FIG. 6 illustrates a flow chart 600 of a method of timing closure according to an embodiment of the present invention.

Step 602 is the entry point for the flow chart 600.

In step 604, a design block is received as input.

In step 606, a parasitic extraction is performed on the design block, and the output file "b.SPEF" is generated. The parasitic extraction should be generated after detailed routing.

In step 608, a delay calculation is performed on the design block by the intelligent design calculator described above with reference to FIG. 1 including crosstalk delay estimation. Incremental crosstalk delay, if available, may be used for some nets.

In step 610, a "b.xtalk.SDF" file is generated as output from the delay calculation for the design block.

In step 612, a static timing analysis is performed.

In step 614, a "b.CriticalNets" file is generated from the static timing analysis for the design block for time critical nets having a path margin less than zero.

In step 616, if timing violations are detected by the static timing analysis performed in step 612, then control is transferred to step 618. Otherwise, control is transferred to step 630.

In step 618, if a crosstalk delay estimate is calculated for the nets in the design block, then control is transferred to step 628. Otherwise, control is transferred to step 620.

In step 620, a crosstalk talk analysis is performed for the design block, for example, by a crosstalk analysis tool such as Gatescope.

In step 622, another static timing analysis is performed.

In step 624, the "b.CriticalNets" file is regenerated from the static timing analysis for the design block for nets having a path margin less than zero.

In step 626, if timing violations are detected in the static timing analysis of the design block, then control is transferred to step 628. Otherwise, control is transferred to step 630.

In step 628, the timing violations detected by the static timing analysis in step 612 or step 622 are corrected, for example, by adjusting the placement or routing of cells in the design block. Control is then transferred to step 606.

Step 630 is the exit point of the flow chart 600.

In the design flow of FIG. 6, the time critical paths are always defined as the true critical paths, that is, the minimum allowable path margin is always zero for both setup and hold time constraints when the estimated interconnect delay includes coupling capacitances. This feature advantageously avoids the requirement of having to select path margins for each combination of design parameters. As a result of defining the minimum allowable path margin as always zero, the number of critical paths may be significantly reduced in the integrated circuit design, thereby effecting a corresponding reduction in crosstalk delay analysis time.

Another advantage to the design flow of FIG. 6 is that timing violations may be corrected without requiring the time consuming use of the crosstalk delay analysis tool. For those timing violations that may not be corrected in the crosstalk delay estimate flow, the crosstalk delay analysis tool may be engaged. Alternatively, each design block may be signed off, that is, checked to ensure timing closure, either with crosstalk delay estimation or with crosstalk delay estimation plus cross talk delay analysis for all timing critical nets, that is, nets belonging to timing paths having negative slack. Still, further, the design flow uses an intelligent delay calculator that can accommodate a mix of different crosstalk delay estimation methods for different blocks in the integrated circuit design.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of estimating crosstalk delay for an integrated circuit design flow comprising steps of:
    (a) receiving an integrated circuit design;
    (b) selecting a list of blocks from the integrated circuit design for which a crosstalk delay is to be estimated for each block in the list of blocks;
    (c) selecting one of a plurality of crosstalk delay estimation algorithms for each block in the list of blocks;
    (d) performing the selected one of the plurality of crosstalk delay estimation algorithms to estimate a delay for each block in the list of blocks; and
    (e) generating as output the estimated crosstalk delay for each block in the list of blocks.

2. The method of claim 1 further comprising steps of:
    (f) for each block in the integrated circuit design for which no crosstalk delay is to be estimated, performing a crosstalk analysis; and
    (g) performing a static timing analysis.

3. The method of claim 1 wherein the plurality of crosstalk delay estimation algorithms includes scaling a coupling capacitance or a total net capacitance.

4. The method of claim 1 further comprising a step of generating a second list of blocks from the integrated circuit design for which no crosstalk delay estimate is to be calculated.

5. A computer program product for estimating crosstalk delay for an integrated circuit design flow comprising:
    a medium for embodying a computer program for input to a computer; and
    a computer program embodied in the medium for causing the computer to perform steps of:
    (a) receiving an integrated circuit design;
    (b) selecting a list of blocks from the integrated circuit design for which a crosstalk delay is to be estimated for each block in the list of blocks;
    (c) selecting one of a plurality of crosstalk delay estimation algorithms for each block in the list of blocks;
    (d) performing the selected one of the plurality of crosstalk delay estimation algorithms to estimate a delay for each block in the list of blocks; and
    (e) generating as output the estimated crosstalk delay for each block in the list of blocks.

6. The computer program product of claim 5 wherein the plurality of crosstalk delay estimation algorithms includes scaling a coupling capacitance or a total net capacitance.

7. The computer program product of claim 5 further comprising steps of:
    (f) for each block in the integrated circuit design for which no crosstalk delay is to be estimated, performing a crosstalk analysis; and
    (g) performing a static timing analysis.

8. The method of claim 1 wherein step (c) comprises selecting a crosstalk delay estimation algorithm from the plurality of crosstalk delay estimation algorithms having a highest accuracy available for each block in the list of blocks.

9. A method of design flow for an integrated circuit comprising steps of:
    (a) receiving as input a design block in an integrated circuit design;
    (b) selecting one of a plurality of crosstalk delay estimation algorithms for the design block;
    (c) estimating a crosstalk delay from the selected one of the plurality of crosstalk delay estimation algorithms;
    (d) performing a static timing analysis on the design block to detect whether a timing violation exists in the design block; and
    (e) correcting the timing violation when a timing violation is detected in the static timing analysis.

10. The method of claim 9 wherein step (d) comprises generating a list of critical nets having a slack less than zero.

11. The method of claim 9 wherein step (c) comprises selecting a crosstalk delay estimation algorithm from the plurality of crosstalk delay estimation algorithms having a highest accuracy available for the design block.

12. A computer program product for design flow for an integrated circuit comprising:
    a medium for embodying a computer program for input to a computer; and
    a computer program embodied in the medium for causing the computer to perform steps of:
    (a) receiving as input a design block in an integrated circuit design;

(b) selecting one of a plurality of crosstalk delay estimation algorithms for the design block;
(c) estimating a crosstalk delay from the selected one of the plurality of crosstalk delay estimation algorithms
(d) performing a static timing analysis on the design block to detect whether a timing violation exists in the design block; and
(e) correcting the timing violation when a timing violation is detected in the static timing analysis.

13. The computer program product of claim 12 wherein step (d) comprises generating a list of critical nets having a slack less than zero.

14. The method of claim 12 wherein step (c) comprises selecting a crosstalk delay estimation algorithm from the plurality of crosstalk delay estimation algorithms having a highest accuracy available for the design block.

* * * * *